United States Patent
Possin et al.

(10) Patent No.: US 6,465,286 B2
(45) Date of Patent: Oct. 15, 2002

(54) METHOD OF FABRICATING AN IMAGER ARRAY

(75) Inventors: George Edward Possin, Niskayuna, NY (US); Robert Forrest Kwasnick, Palo Alto, CA (US)

(73) Assignee: General Electric Company, Niskayuna, NY (US)

( * ) Notice: Subject to any disclaimer, the term of this patent is extended or adjusted under 35 U.S.C. 154(b) by 104 days.

(21) Appl. No.: 09/681,070

(22) Filed: Dec. 20, 2000

(65) Prior Publication Data

US 2002/0076844 A1 Jun. 20, 2002

(51) Int. Cl.7 .......................... H01L 21/00; H01L 21/84
(52) U.S. Cl. ................. 438/155; 438/149; 438/151; 438/152; 438/153; 438/154
(58) Field of Search ................. 438/149–166, 438/30

(56) References Cited

U.S. PATENT DOCUMENTS

| | | | |
|---|---|---|---|
| 5,075,244 A | * 12/1991 | Sakai et al. | 257/59 |
| 5,187,602 A | * 2/1993 | Ikeda et al. | 349/39 |
| 5,281,546 A | 1/1994 | Possin et al. | |
| 5,362,660 A | 11/1994 | Kwasnick et al. | 437/40 |
| 5,399,884 A | 3/1995 | Wei et al. | |
| 5,435,608 A | 7/1995 | Wei et al. | |
| 5,480,810 A | 1/1996 | Wei et al. | |
| 5,516,712 A | 5/1996 | Wei et al. | |
| 5,663,577 A | 9/1997 | Kwasnick et al. | |
| 5,980,763 A | * 11/1999 | Young | 216/23 |
| 6,137,552 A | * 10/2000 | Yanai | 349/106 |

FOREIGN PATENT DOCUMENTS

| JP | 06029510 A | * 2/1994 | H01L/27/146 |
|---|---|---|---|
| JP | 2000208750 A | * 7/2000 | H01L/27/146 |

* cited by examiner

Primary Examiner—Richard Booth
Assistant Examiner—Jennifer M. Kennedy
(74) Attorney, Agent, or Firm—Lester R. Hale; Patrick K. Patnode

(57) ABSTRACT

RD-25953-17-A method of fabricating an imager array having a plurality of pixels is provided in which each pixel is made up of a photodiode and a corresponding thin film transistor (TFT) switching device, the method including the steps of depositing materials to form the photodiode island and to form a TFT body over a gate electrode, then depositing a layer of source/drain metal over the silicon layers of the TFT body, and over a common dielectric layer, removing sections of the source/drain metal layer to expose a portion of the silicon layers of the TFT body, but leaving regions of sacrificial source/drain metal over the photodiode islands, and forming a back channel in the TFT body by a back channel etch step. The method further includes then removing the sacrificial regions of source/drain metal from above the photodiode islands, and depositing a passivation layer over the entire exposed surface of the array.

17 Claims, 5 Drawing Sheets

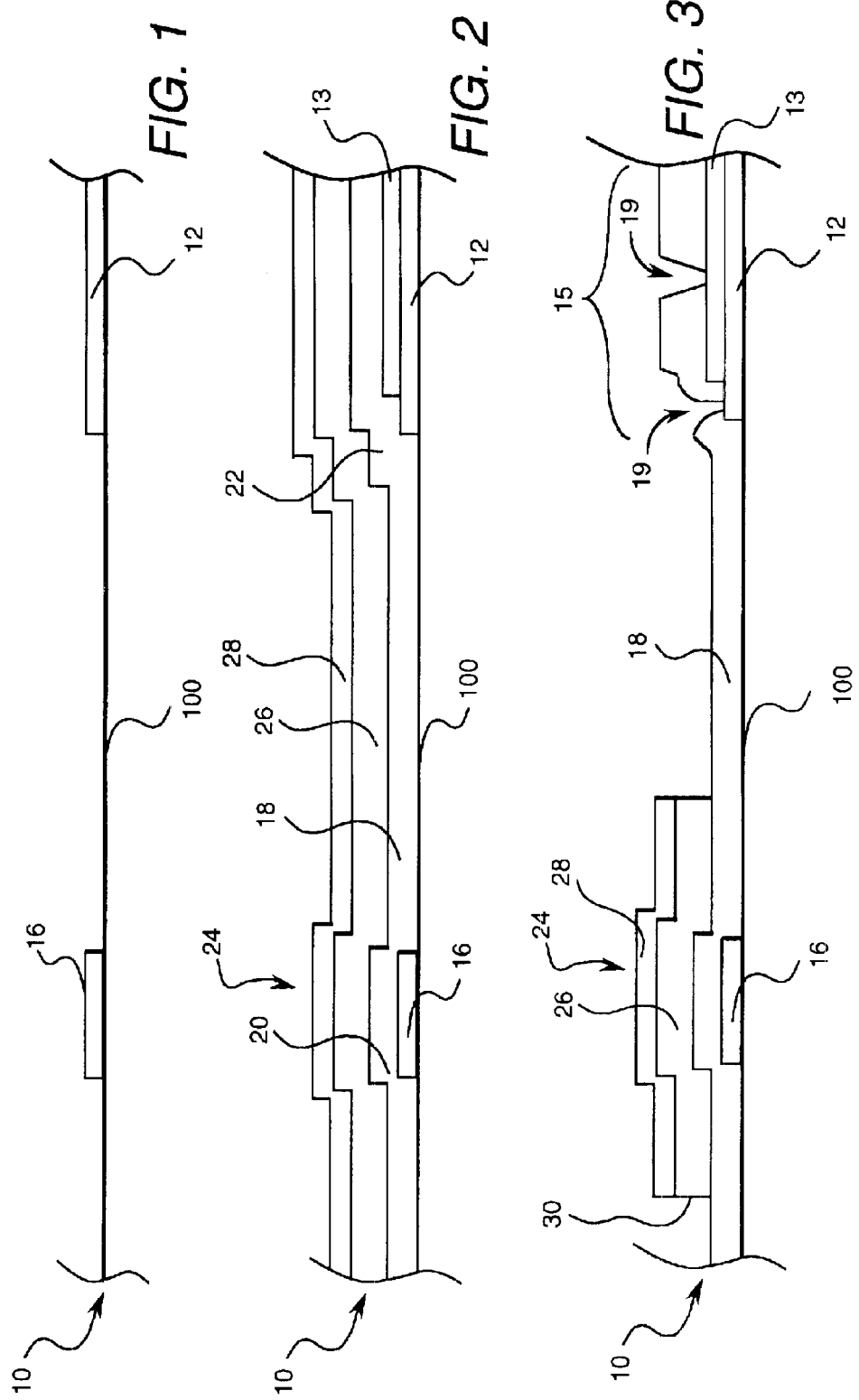

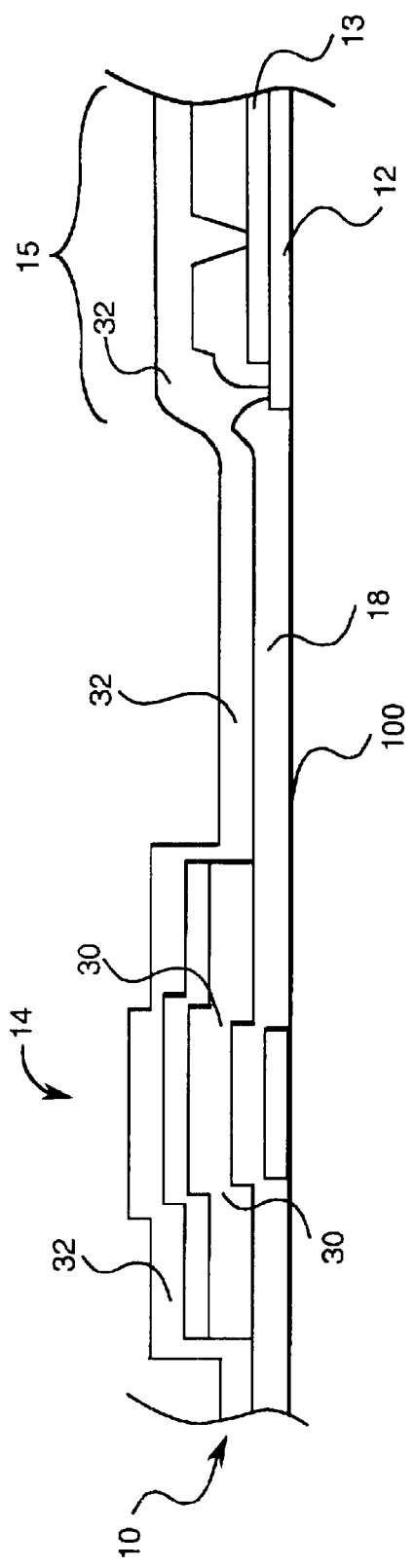
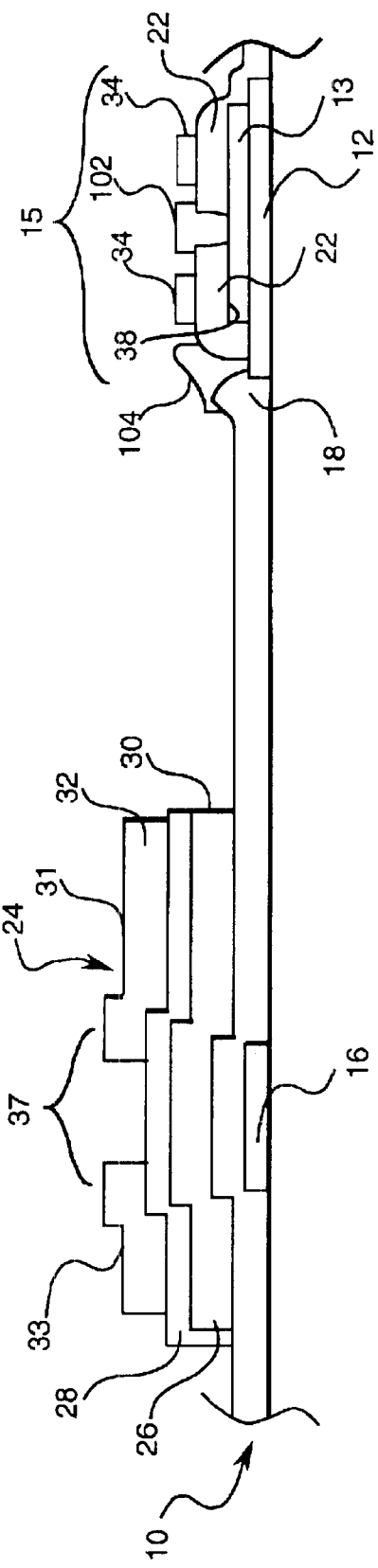

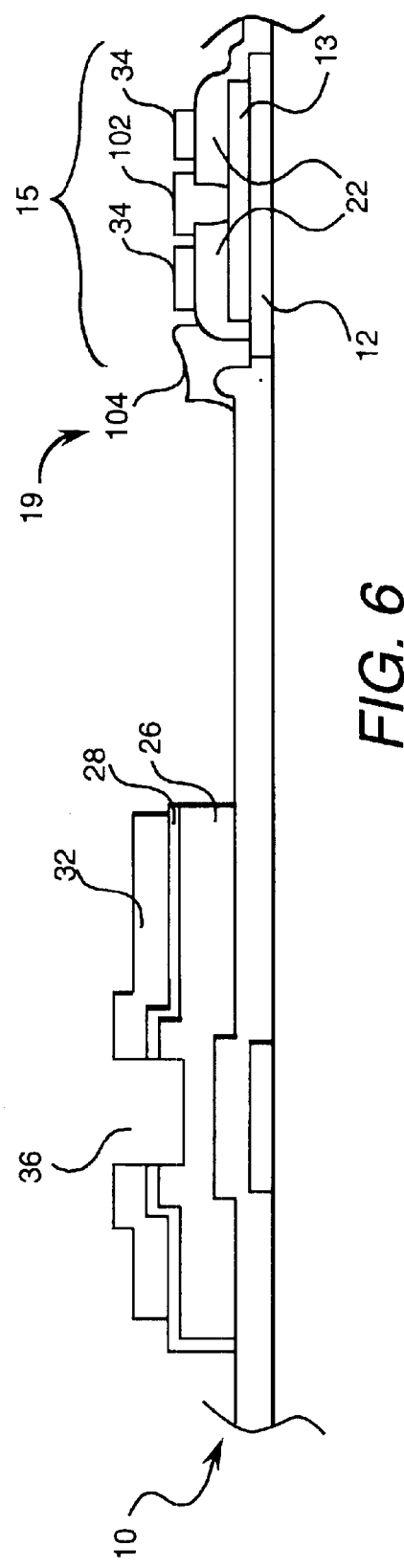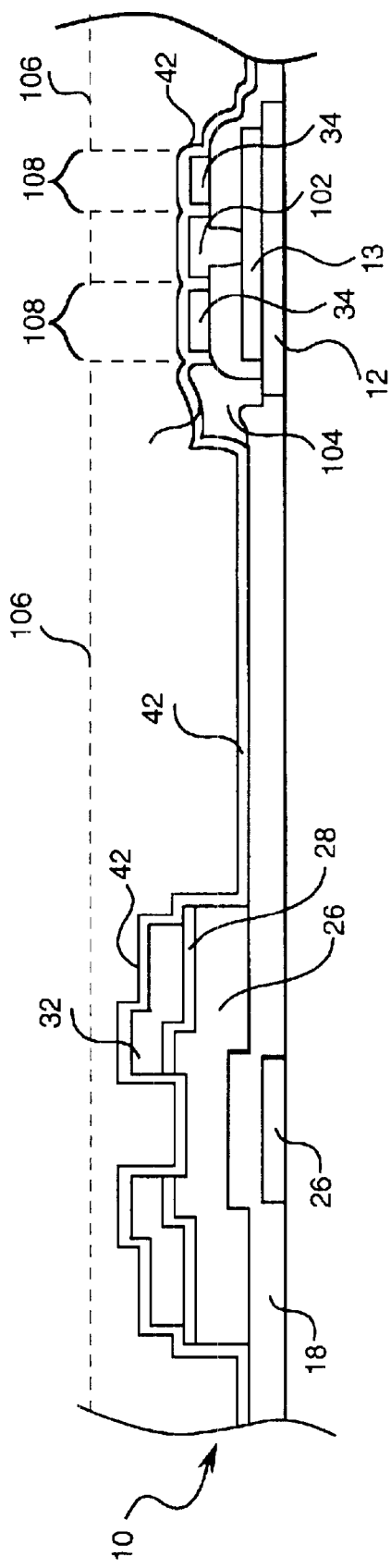

US 6,465,286 B2

METHOD OF FABRICATING AN IMAGER ARRAY

The U.S. Government may have certain rights in this invention pursuant to Contract number 70NANB5H1099 awarded by the National Institute of Standards and Technology.

BACKGROUND OF INVENTION

The invention relates to a method of fabricating imager arrays in which charge retention effects are minimized, and specifically to a reduced mask process for producing thin film transistor (TFT) addressed imagers, in which charge trapping in the TFTs is reduced.

Solid state imaging devices are used in medical diagnostics, for example, as x-ray imagers, and for other light imaging uses. Such imaging devices typically comprise arrays of photosensor elements with associated switching elements, and address (scan) and read out (data) lines. Typically, the photosensor elements are photodiodes, and the switching elements are thin film field effect transistors (TFTs or FETs). The photosensor and associated switching device may be referred to as a pixel.

Imaging devices of this type may be produced by a fabrication technique or sequence known as a reduced mask set process, one example of which is disclosed in U.S. Pat. No. 5,480,810.

The photosensor array of the imaging device is designed to generate an electrical signal corresponding to an incident optical photon flux, the photons having typically been generated, in the case of medical x-ray imaging, by radiation absorbed in a scintillator receiving incident radiation passing from a source through an object to be imaged. The layout and construction of the photosensor array, including the photodiodes or pixels, address lines, and associated TFTs, enables the device to individually address each photosensor, so that the charge developed by each photosensor during a cycle of exposure to incident radiation can be selectively read.

While the performance of the imager is dependent on many factors, one important image quality parameter involves control of charge retention offsets, which cause variability in readings from one pixel to the next. In the TFT-addressed imaging devices, charge retention involves charge trapping in the individual addressing TFTs. Such variation in readings from respective TFTs contributes to read out noise and further requires that read out circuits be able to handle a wider range of signal, thereby limiting image quality.

In the technique referred to above as a reduced mask set process, the photodiodes are fabricated or formed prior to the formation of the associated TFTs. In the reduced mask set processes previously proposed, control of charge retention continues to be a factor. Variations in the charge trapping from pixel to pixel in an imager fabricated by prior reduced mask set processes can be in excess of 50 fentocoulomb, which generally is a level of variation higher than desirable for many types of imaging.

It is therefore desirable to develop a reduced mask set process that yields an imager in which charge retention and charge trapping in the TFTs are reduced and the charge retention offsets are rendered more uniform.

SUMMARY OF THE INVENTION

In an exemplary embodiment of the invention, a method for fabricating an imager array having a plurality of pixels, each pixel having a thin film transistor (TFT) switching device coupled to a respective photosensor, includes the steps of 1) forming a gate electrode and a photosensor bottom electrode on a substrate; 2) forming a photosensor body on at least a portion of the photosensor bottom electrode; 3) depositing a common dielectric layer over the gate electrode and over the photosensor body; 4) forming a TFT body on the common dielectric layer such that the TFT body is disposed above and in a spaced relationship with the gate electrode; 5) depositing a source/drain metal conductive layer over the TFT body and over exposed portions of the common dielectric layer; 6) removing portions of the source/drain metal conductive layer in accordance with a predetermined pattern so as to expose a portion of an upper surface of the TFT body, and so as to leave at least one region of source/drain metal remaining disposed on the common dielectric layer above the photosensor body; 7) etching the exposed portion of the TFT body to form a back channel region in the TFT body, the back channel region being disposed over the gate electrode; and 8) removing the at least one region of the source/drain metal disposed on the common dielectric layer above the photosensor body.

BRIEF DESCRIPTION OF DRAWINGS

FIGS. 1–8 are substantially cross-sectional views of the device produced using the sequential processing steps employed in the method for producing an imaging array in accordance with an embodiment of the present invention.

DETAILED DESCRIPTION

Figure 8:
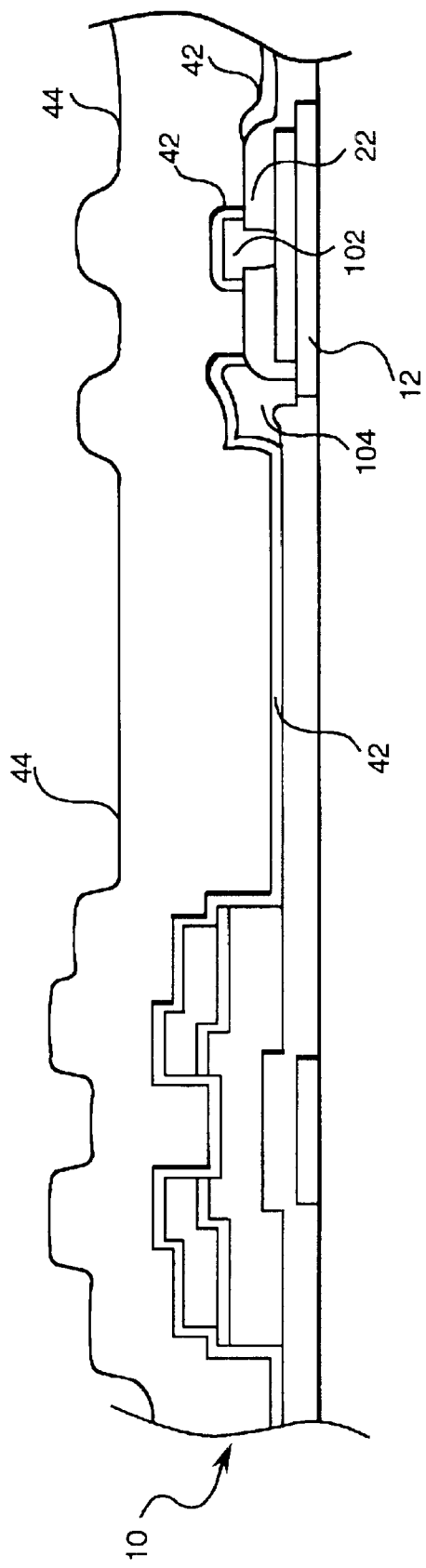

The process of the present invention provides means by which an imaging array can be fabricated that exhibits improved performance with respect to conventional fabrication techniques, especially as outlined in the reduced mask process as noted above. The array resulting from the process of the present invention exhibits less charge retention than the previous process. The charge retention offset is unequilibriated charge in the switching TFT that causes the read out signal to vary from pixel to pixel. It has been determined that one component of this offset is due to trapped charge at the top surface of the TFT. It has further been determined that one component of this charge retention offset is a function of the quality of the top surface of the TFT. As used herein, quality of the surface and the like refers to the condition and electrical performance characteristics resulting from that condition of semiconductor material in a semiconductor device such as a TFT. It is desirable that the charge retention offsets should be as small and as uniform as possible in order to obtain high quality images because of limitation of the readout circuitry; the process of the present invention provides a top surfaces of back channel regions of TFTs that reduce the variability seed in charge retention between pixels.

Referring to the sequence of FIGS. 1–8, a cross-section of a representative portion of a thin film transistor (TFT) addressed imaging array 10, illustrating the portion of the array at the various stages of the fabrication method of the present invention, is presented. The portion of the array 10 depicted in FIGS. 1–8 illustrates a representative pixel 101 (FIG. 9) including a photosensor shown schematically as a photodiode body 15 and a respective pixel TFT 14 (FIG. 4). The complete array 10 making up the imaging device typically has on the order of one million ($1\times10^{16}$) selectively addressable photodiodes, together with their associated TFT switching devices, and address lines and readout lines. Typically, in accordance with generally known fabrication processes, the fabrication of the complete array of pixels and associated components making up the photosensor array proceeds simultaneously.

FIG. 1 depicts a gate electrode layer 16 and the diode bottom electrode 12 that are formed on substrate 100 in the initial steps of a reduced mask set process. The substrate 100 typically comprises an insulative material, such as glass. Gate electrode 16 and a lower electrode layer 12 are formed by depositing and patterning a layer or layers of a conductive material. Suitable materials for this layer include indium-tin-oxide (ITO), or a metal such as chromium, titanium, molybdenum, aluminum, or the like. The layer of material may be patterned and etched, for example, using an appropriately patterned photoresist mask, followed by an etching step. For purposes of use herein, terms such as over, above, and the like are used only for purposes of denoting relative position in the drawings and are not meant to imply any limitations on operation of the assembled device.

The photosensor body 15 is then formed by the deposition, patterning and etching of layers 13 (not separately illustrated) of, for example, amorphous silicon (referred to as a-Si), a first layer being an n-type doped amorphous silicon, a second layer being an undoped a-Si layer, also referred to as intrinsic amorphous silicon (i-Si), and a third layer being a p-type doped amorphous silicon. An electrically conductive transparent cap layer (not separately shown) of, for example, indium-tin-oxide, having a thickness of about 0.05 to 0.2 microns is typically deposited over the p-type doped silicon layer. The thickness of the photosensor body 15 may be, for example, in the range of about 0.5 $\mu$m to about 2.5 $\mu$m.

The patterning steps for forming photosensor body 15 commonly involve the use of photolithography to expose predetermined portions of the silicon layers, and removing the exposed material by reactive plasma ion etching (RIE). Suitable etchants typically have fluorine or chlorine components present therein, examples of which are carbon tetrafluoride ($CF_4$), sulfur hexafluoride ($SF_6$) and hydrogen chloride gas (HCl).

Referring to FIG. 2, a common dielectric layer 18 is then deposited over gate electrode 16, the exposed portion of substrate 100, and photosensor body 15. The dielectric layer is typically comprises inorganic material such as silicon nitride, silicon oxide, or combination thereof, and may be deposited by a plasma-enhanced chemical vapor deposition (PECVD) process to a thickness in the range between about 0.15 $\mu$m and about 0.5 $\mu$m. The dielectric layer 18 commonly is referred to as a monolithic layer comprising a gate dielectric layer portion 20 disposed atop the gate electrode 16, and a photosensor passivation layer portion 22 in an area where the dielectric layer is disposed above the photosensor body 15.

Also illustrated in FIG. 2 are the initial layers deposited in forming a TFT body 24 over the gate dielectric portion 20 of common dielectric layer 18. As used herein, the term "TFT body" refers generally to the materials disposed in a spaced relationship with gate dielectric layer portion 20 of common dielectric layer 18 that will comprise part of the TFT in the completed array. A layer 26 of intrinsic amorphous silicon (i-Si) is first deposited over common dielectric layer 18, followed by a layer 28 of a doped semiconductor material, typically an amorphous silicon (a-Si) doped to exhibit n+ conductivity, also referred to herein as n+ doped silicon or n+Si. Layers 26, 28 may preferably be deposited using a PECVD process, with i-Si layer 26 being deposited to a thickness of between about 1500 Å to about 5000 Å, while n+Si layer 28 preferably will have a thickness of about 300 Å to about 1000 Å, in the same PECVD deposition as the dielectric (metal cap layer comprised of Cr or Mo is substantially coincident with the n+Si and has a thickness of about 20 nm to about 100 nm).

In FIG. 3, it can be seen that the process then involves the step of removing the i-Si layer 26 and n+Si layer 28 from the common dielectric layer 18, except in the vicinity of gate electrode 16, to form an island-type structure 30, which will ultimately be formed into the TFT body 24. The unwanted material is preferably removed by known patterning and etching steps, such as by using photolithographic techniques.

Further, vias 19 are formed in layer 18. Patterning and etching is used to form the vias (that is, holes in the overlying materials to expose an underlying material) in the dielectric layer 18. At least one such via 19 is disposed above diode body 15 to permit electrical contact to one side of the photosensor. Additionally, vias are provided to the lower electrode layer 12 and optionally provided to gate electrode layer 16. As outlined below, electrical contact is made to these layers through portions of the source/drain metal conductive layer 32 that are patterned to provide desired electrode contacts. Either the top vias or the lower electrode vias are electrically coupled together through the source/drain metal conductive layer to provide a common source of electrical bias for the photosensors. This electrical contact is typically common to all photosensors in the array and is referred to as the common contact.

As shown in FIG. 4, a source/drain metal conductive layer 32 is deposited over all exposed surfaces, including the TFT island-type structure 30 of the two silicon layers, the common dielectric layer 18, and the photodiode body 15. The term source/drain or S/D refers to the electrically conductive material that is deposited to form both the source and the drain electrode of the TFT. The common electrode provides electrical contact to one side of each photosensor body. Source/drain layer 32 commonly is deposited by sputtering, and a typical thickness of this layer is in the range between about 2000 Å and about 10000 Å.

Figure 9:
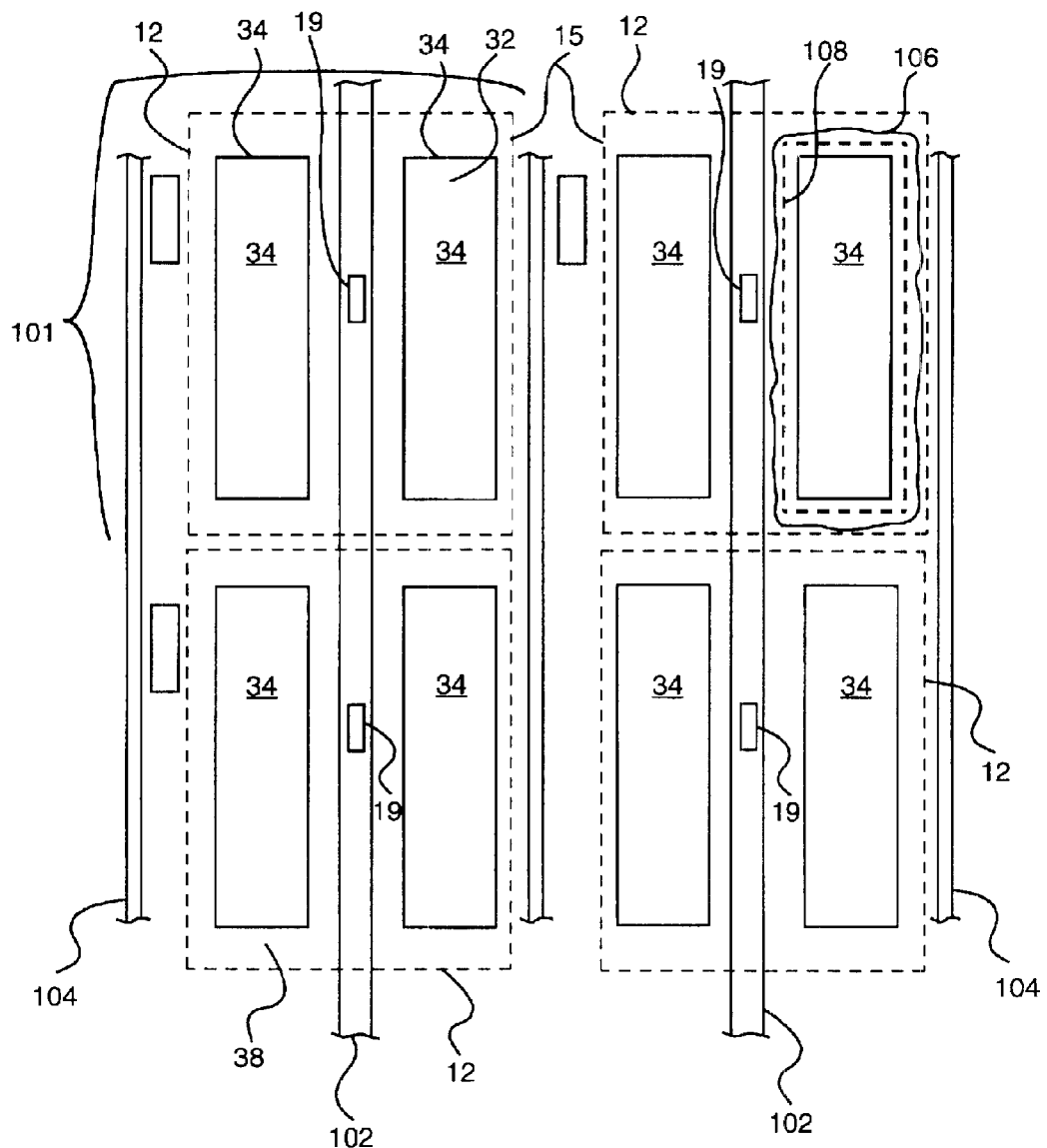
FIG. 9 is a substantially schematic top plan view of an imaging device illustrating the regions of source/drain metal overlying the photosensors that is left in place while a back channel etch step of the process is conducted.

The source/drain metal conductive layer 32 is then patterned and etched, as seen in FIG. 5, to remove the source/drain metal from at least a portion of the top surface of island 30, to expose the underlying silicon layer 28, in a region 37, which after further processing, will be referred to as a back channel region 36 (FIG. 6). This step also provides respective source electrodes 31 and drain electrodes 33 for each TFT. Further, this step is conducted using a large fill factor mask (that is, deposited to cover enough of the surface to be processed to provide the desired structure following the processing step), such that diode sacrificial regions 34 (see also FIG. 9) of the source/drain metal 32 are left atop the photosensor passivation layer portion 22 of the common dielectric layer 18. As a result, the source/drain material is disposed above a substantial portion of the area of the upper surface 38 of diode island 15. A substantial portion, as used in this context, refers to the diode sacrificial region typically extending over greater than about 60% of, and more preferably between about 60% to about 80% of, the area of upper surface 38 of the photosensor body 15. As can be seen in FIG. 9, the step of patterning and etching the source/drain metal is also used to produce photosensor common electrode lines 102 and data lines 104.

A reactive ion etch step is then performed to remove the n+Si material 28 exposed in region 37 of the island structure 30. In addition, a small amount of the i–Si material 26 underlying the n+Si material 28 in region 37 is typically removed, which processing steps create a back channel region 36 of TFT body 24 (FIG. 6). The source/drain metal 32 remaining disposed above layers 26, 28 in the TFT region 14, serves as a mask to prevent removal of the portions of silicon layers 26, 28, disposed beneath the source/drain metal.

The step corresponding to this step in prior processes has been referred to as a back channel etch (BCE) step. In such prior processes, substantially all of the source/drain metal 32 that is not present in the final array structure, including the large regions 34 atop the photosensor body 15, is removed prior to the BCE step.

It has been determined in the development of the present invention that the reactive ion etch step used in creating the back channel of the TFT body according to prior processes resulted in producing a degraded quality Si surface in back channel region 36. Degraded quality as used herein refers to a surface that contributes to charge trapping (and hence higher noise from the TFT) as outlined above. Further, the degraded quality silicon surface results in unacceptable levels of variation of charge trapping between respective TFTs in the array (determined from the design standpoint of acceptable noise in the array). It was further determined that leaving the relatively large diode regions 34 of source/drain metal disposed over the photosensor body 15 provides a sacrificial pad that has a beneficial effect during the reactive ion etch used in creating back channel region 36, resulting in an exposed Si surface in back channel etch region 36 that provides less charge trapping, and greater uniformity of charge trapping between respective pixels in the array than had been produced using prior processes.

While the sacrificial diode sacrificial source/drain metal regions 34 aid in producing the desired Si surface during the back channel etch process step, the source/drain metal is opaque to light, and therefore this sacrificial material 34 must be removed so as to not impair the functioning of the underlying photodiode when the device is in operation. Accordingly, the process of the present invention further includes a step of removing the diode sacrificial source/drain metal regions 34. Because this material is removed after all other areas of source/drain metal (common electrodes 102, data lines 104, source and drain of TFT have been patterned and formed into their final configuration, it is desirable that the diode sacrificial source/drain regions 34 to be removed be originally formed so as to be physically separated by about 4 microns or more from those areas of source/drain metal that are to remain on the array (FIG. 9). This separation serves to prevent undesirable undercut of the source/drain metal to be retained on the array, which undercut might result from the step of removing the diode sacrificial regions 34. As seen in FIG. 9, this separation typically is accomplished by forming two respective regions 40 over each diode island 15, with each region being spaced from electrode lines 102, 104 disposed along the columns of photosensors.

The diode sacrificial metal regions 34 commonly are removed by an etching process. It has been experienced that the removal of the diode sacrficial source/drain metal regions 34 by etching immediately after the back channel etching is performed can lead to a degradation in the performance of the completed device because the back channel surface of TFT body 24, is exposed to the further processing. Therefore, it is desired that the removal of the diode sacrificial source/drain metal regions 34 include a step of depositing a thin dielectric passivation layer 42 (FIG. 7) over all exposed surfaces of the array prior to the etching to remove the sacrificial diode S/D regions 34. The layer typically comprises a $SiO_x$ or $SiN_x$ material having thickness in the range of about 100 nm to 500 nm. Following the deposition of the thin passivation layer 42, the masking and etching steps to remove diode sacrificial metal regions 34 are carried out.

As shown schematically in broken lines in FIG. 7, a removal mask 106 is formed on the passivation layer 42, the mask having openings 108 that are slightly larger in area than the source/drain metal regions 34 to be removed (see also FIG. 9). This mask may be prepared by conventional photolithographic techniques, for example.

After the photoresist is patterned and developed to create the openings 108, which expose the underlying passivation layer material deposited over the source/drain metal regions 34 to be removed, the thin passivation layer 42 is completely etched away from an area slightly larger than the area of the underlying source/drain metal, due to the increased size at the opening 108. This etching step preferably uses BHF (buffered hydrofluoric acid) which does not substantially etch ITO or amorphous silicon (that is, the etchant selective to etching one layer relative to others). The source/drain metal 34 is then preferably wet etched using an etchant comprising a mixture of nitric, phosphoric and acetic acids which also does not substantially attack the ITO or the amorphous silicon. The photoresist protects all other areas of source/drain metal from being etched away, in that those areas are physically separated from regions 34 and thus not exposed in openings 108 in the photoresist mask.

FIG. 8 illustrates the finished device, wherein the source/drain metal regions 34 (FIG. 7) have been removed from atop the common dielectric layer 18 and photosensor body 15. FIG. 8 also illustrates that, in a final processing or fabrication step, a thick passivation or barrier layer 44 (approximately about 0.5 to 1.5 microns thick comprising silicon nitride, silicon oxide, or combinations thereof) is deposited over the entire device, in order to seal the array from environmental conditions, such as moisture. The passivation or barrier layer is also patterned to expose edge contacts (not shown) for connecting the array to one or more circuits not forming part of the array.

The present invention provides a method of fabricating an photosensor array using a reduced mask set technique in which, prior to performing a step known as a back channel etch (BCE) a source/drain (S/D) metal layer is deposited, patterned and etched using a large fill factor mask, i.e., large fraction of the pixel area (e.g., about 50% or more of the area of the array. The large fill factor mask provides the pattern for the TFT source-drain electrode arrangement and other regions of source drain material, such as address lines. The source/drain (S/D) metal layer is patterned and etched to remove the S/D material from above certain parts of the underlying gate and a common dielectric layer, but the patterning and etching leaves a region of the S/D material substantially covering most of the area of the underlying photosensors. A reactive ion etch is performed to create a back channel disposed over a gate electrode, using unremoved S/D metal as a mask. The process further involves removing excess S/D metal from above the photosensors and then applying a passivation layer over the device. The removal of this S/D metal can be accomplished by depositing a thin passivation dielectric layer on the surface of the structure, and patterning and etching the dielectric material and, with the same photomask, the S/D metal overlying the photosensors. A finishing step of depositing, patterning and etching a thick passivation layer is then conducted.

The process yields an array-based imager which has a back channel surface of i–Si material in the TFTs that provides, with respect to prior art processes, more reproducible, better controlled, charge trapping characteristics at the back channel interface of the devices produced.

While only certain features of the invention have been illustrated and described herein, modifications and changes may occur to those skilled in the art. It is, therefore, to be understood that the appended claims are intended to cover such modifications and changes as fall within the true spirit of the invention.

What is claimed is:

1. A method of fabricating an imager array having a plurality of pixels, each pixel comprising a thin film transistor (TFT) and an associated photosensor, the method comprising, for each respective pixel, the steps of:

forming a gate electrode and a photosensor bottom electrode on a substrate;

forming a photosensor body disposed on at least a portion of said photosensor bottom electrode;

depositing a common dielectric layer over said gate electrode and over said photosensor body;

forming a TFT body on said common dielectric layer such that said TFT body is disposed above and in a spaced relationship with said gate electrode;

depositing a source/drain metal conductive layer over said TFT body and over exposed portions of said common dielectric layer;

removing portions of said source/drain metal conductive layer in accordance with a predetermined pattern so as to expose a portion of an upper surface of said TFT body, and so as to leave at least one sacrificial region of source/drain metal remaining disposed on said common dielectric layer above said photosensor body;

etching said exposed portion of said TFT body to form a back channel region in said TFT body, said back channel region being disposed over said gate electrode; and then removing said at least one sacrificial region of said source/drain metal disposed on said common dielectric layer above said photosensor body.

2. The method of claim 1, wherein the step of removing said at least one region of said source/drain metal disposed on said common electrode dielectric layer above said photosensor body further comprises the steps of:

depositing a first passivation layer over said exposed back channel region and all exposed portions of source/drain metal and said common dielectric layer;

forming, on said first passivation layer, a mask having an opening therein exposing a portion of said first passivation layer overlying said at least one region of source/drain metal, said opening being larger in area than an upper surface area of said at least one sacrificial region of source/drain metal; and etching said exposed portion of said first passivation layer and said at least one sacrificial region of source/drain metal underlying said first passivation layer to remove said first passivation layer and said at least one sacrificial region of source/drain metal from said common dielectric layer.

3. The method of claim 2, wherein said first passivation layer is a layer of $SiO_x$-type material.

4. The method of claim 2, wherein said first passivation layer has a thickness on the order of about 100 nm to about 500 nm.

5. The method of claim 1, wherein said at least one sacrificial region of source/drain metal is physically separated from all other source/drain metal present in said imager array.

6. The method of claim 1, wherein said step of etching said exposed portion of said TFT body comprises a reactive ion etch (RIE) process.

7. The method of claim 1, wherein said step of removing portions of said source/drain metal so as to leave said at least one sacrificial region of source/drain metal above said photosensor body is conducted using a mask such that said a plurality of sacrificial regions of source/drain metal are disposed over respective ones of said photosensor bodies.

8. The method of claim 7, wherein a plurality of sacrificial regions of source/drain metal are left remaining above said photosensor body, and wherein said plurality of sacrificial regions collectively substantially cover said photosensor body.

9. The method of claim 1, wherein said at least one sacrificial region source/drain metal left remaining disposed above said photosensor body overlies on the order of about 60% or greater of the area of an upper surface of said photosensor body.

10. The method of claim 9, wherein said at least one sacrificial region of source/drain metal left remaining disposed above said photosensor body overlies on the order of about 60–80% of the area of said upper surface of said photosensor body.

11. The method of claim 1, wherein said photosensor body is fabricated by the steps of sequentially depositing semiconductor layers 3 comprising a layer of an n+-doped silicon, a layer of an intrinsic amorphous silicon, and a layer of a p+-doped silicon over said portion of said photosensor bottom electrode.

12. The method of claim 1, wherein said step of forming said TFT body on said common dielectric layer further comprises the steps of sequentially depositing a layer of intrinsic amorphous silicon and a thinner layer of n+-doped silicon, and patterning and etching said silicon layers to form an island-type TFT body disposed above said gate electrode.

13. A method of fabricating an imager array having a plurality of pixels, each pixel comprising a respective thin film transistor (TFT) switching element and an associated photodiode, the method comprising the steps of:

forming a plurality of gate electrodes and a plurality of photosensor bottom electrodes on a substrate;

forming a plurality of photosensor bodies disposed on respective ones of said photosensor bottom electrodes;

depositing a common dielectric layer over said plurality of gate electrodes and said plurality of photosensor bodies;

forming a plurality of TFT bodies on said common dielectric layer such that respective ones of said TFT bodies are disposed in a spaced relationship with respective ones of said gate electrodes;

depositing a source/drain metal conductive layer over said TFT bodies and exposed portions of said common dielectric layer;

removing portions of said source/drain metal conductive layer so as to form respective source and drain electrodes for respective ones of said TFT bodies and further to form a plurality of respective sacrificial source/drain regions disposed over the common electrode dielectric layer overlying said photosensor bodies;

etching respective exposed portions of said TFT bodies between the respective TFT source and drain electrodes to form a back channel region in of said TFT bodies, the respective back channel regions in said TFTs in said array exhibiting substantially the same charge retention characteristics when said array is in operation;

removing said plurality of sacrificial source/drain regions; and depositing a passivation layer over said array.

14. The method of claim 13 wherein the step of forming said respective back channel regions further comprises the step of etching an N+ silicon and an intrinsic silicon underlying said N+ silicon disposed between respective source and drain electrodes of said TFTs.

15. The method of claim 14 wherein the step of etching N+ silicon and intrinsic silicon comprises reactive ion etching.

16. The method of claim 13 further comprising the step of forming a plurality of address lines from said source/drain metal material.

17. The method of claim 15 wherein said plurality of sacrificial source/drain regions comprises a plurality of such regions disposed over a respective photosensor body.

* * * * *